United States Patent [19]
Nakashima

[11] Patent Number: 6,154,074
[45] Date of Patent: Nov. 28, 2000

[54] SEMICONDUCTOR DEVICE WITH TEST CIRCUIT FOR HIGH ACCURACY CHIP TESTING

[75] Inventor: Katsuya Nakashima, Nagasaki, Japan

[73] Assignee: Sony Corporation, Tokyo, Japan

[21] Appl. No.: 09/072,024

[22] Filed: May 5, 1998

[30] Foreign Application Priority Data

May 26, 1997 [JP] Japan ..................................... 9-135460

[51] Int. Cl.[7] ..................................................... H03L 7/00
[52] U.S. Cl. .............................. 327/163; 327/161; 331/17
[58] Field of Search ..................................... 327/141, 161, 327/162, 163, 100, 231, 147, 153; 375/371, 373, 374, 375, 376; 331/17, 57, DIG. 2

[56] References Cited

U.S. PATENT DOCUMENTS

| | | | |
|---|---|---|---|
| 4,066,969 | 1/1978 | Pearce et al. ............................ | 367/125 |
| 4,974,234 | 11/1990 | Brandt ..................................... | 375/226 |
| 5,097,489 | 3/1992 | Tucci ...................................... | 375/374 |
| 5,351,091 | 9/1994 | Hosoya et al. ........................... | 348/505 |
| 5,636,254 | 6/1997 | Hase et al. ............................... | 375/371 |

*Primary Examiner*—Timothy P. Callahan
*Assistant Examiner*—Minh Nguyen
*Attorney, Agent, or Firm*—Ronald P. Kananen; Rader, Fishman & Grauer

[57] ABSTRACT

By providing a test circuit including a reference timing generator, a phase error detector, and a comparator, the output signal of the comparator is set in response to the timing of level change of the result of processing of the functional circuit. The phases of the reference pulse generated by the reference timing generator using a control signal as a trigger and the output signal of the comparator by the phase error detector are compared, and the level of a judging signal is set according to the result of the comparison. The judging signal is held temporally by a register, then output to an output pin through a buffer. Using a selector, the held signal of the register is output during the test operation, while the result of processing of the functional circuit is output during normal operation. As a result, it is possible to detect the quality of the chip without using an expensive LSI tester.

30 Claims, 4 Drawing Sheets

FIG. 2B  $S_{PUL}$

FIG. 2C  $S_R$

FIG. 2D  $S_{CMP}$

FIG. 2G  $S'_{CMP}$

SEMICONDUCTOR DEVICE WITH TEST CIRCUIT FOR HIGH ACCURACY CHIP TESTING

BACKGROUND OF THE INVENTION

1. Field of the Invention

The present invention relates to a semiconductor device, and more particularly to a semiconductor device having an on-chip reference timing generator and that is capable of testing the chip's operation with high accuracy in accordance with the reference timing.

2. Description of the Related Art

In recent years, the operating speed of semiconductor devices has been improved along with their increasing miniaturization and the increasing reduction of the power consumption. For example, the operating frequency of a high-speed memory has become higher than 200 MHz, and the access time has been shortened to about 2.5 ns. In order to ensure the quality of semiconductor devices operating at such a high speed, it is necessary to test the semiconductor chips using high accuracy large scale integrated circuit (LSI) testers before shipment.

In the semiconductor devices of the related art, high-speed operational clock signals were supplied to the chips for testing. Expensive LSI testers were necessary for checking the operation. Further, since the measurement accuracy of LSI testers was limited, the test precision deteriorated when the measurement error of the LSI testers was greater than the required specifications. As a result, there was the disadvantage that errors were liable to occur in judging the quality of semiconductor chips.

SUMMARY OF THE INVENTION

The present invention was made in consideration of the above circumstances and has as an object to provide a semiconductor device that can be tested with a high accuracy during the pre-shipment inspection without using expensive LSI testers by providing a built-in test circuit.

To achieve the above object, according to a first aspect of the present invention, there is provided a semiconductor device having a functional circuit for performing predetermined processing in accordance with an input signal and capable of testing the operation of the functional circuit, comprising a reference signal generator for generating a reference signal at a predetermined timing in accordance with the input signal and a judging means for comparing phases of a processed signal of the functional circuit and the reference signal and judging the quality of the functional circuit in accordance with the results of the comparison.

Preferably the reference signal generator comprises a delay circuit for delaying the input signal by a predetermined delay time and outputting the delayed signal as the reference signal or a PLL circuit for generating an oscillating signal at a predetermined frequency in accordance with the input signal.

According to a second aspect of the present invention, there is provided a semiconductor device having an internal circuit operating synchronously with an external clock signal and performing predetermined processing in accordance with an input signal, comprising a reference signal generator for generating a reference signal at a predetermined timing in accordance with the external clock signal and an input timing controlling means for controlling the timing of inputting the input signal to the internal circuit in accordance with the reference signal.

According to a third aspect of the present invention, there is provided a semiconductor device operating synchronously with an external clock signal, comprising a reference clock signal generator for generating a reference clock signal having a predetermined frequency in accordance with the external clock signal and a reference signal generator for generating a reference signal having a predetermined phase error with the reference clock signal based on the reference clock signal.

According to the present invention, a reference signal having a predetermined timing is generated by an on-chip reference signal generator in accordance with an input signal from outside of the chip. A functional circuit is provided on the same chip for performing predetermined processing in accordance with the input signal. The result of the processing is output after a predetermined time lag from the input signal. The phases of the output signal of the functional circuit and the reference signal are compared by a phase comparison means. Whether the functional circuit operates normally or not is judged in accordance with the results of the comparison.

Further, in a semiconductor device operating synchronously with an external clock signal, namely a synchronous semiconductor device, a reference signal having a predetermined timing is generated in accordance with the external clock signal, the timing of input of the input signal to an internal circuit is controlled by the reference signal, and the setup and holding of the internal circuit can be tested with a high accuracy.

Furthermore, a reference clock signal is generated by, for example, a PLL circuit in accordance with an external clock signal. By generating a reference signal having a predetermined phase error from the reference clock signal, the reference timing for chip testing can be controlled in accordance with the reference signal.

BRIEF DESCRIPTION OF THE DRAWINGS

These and other objects and features of the present invention will become clearer from the following description of the preferred embodiments given with reference to the attached drawings, in which.

DESCRIPTION OF THE PREFERRED EMBODIMENTS

First Embodiment

Figure 1:
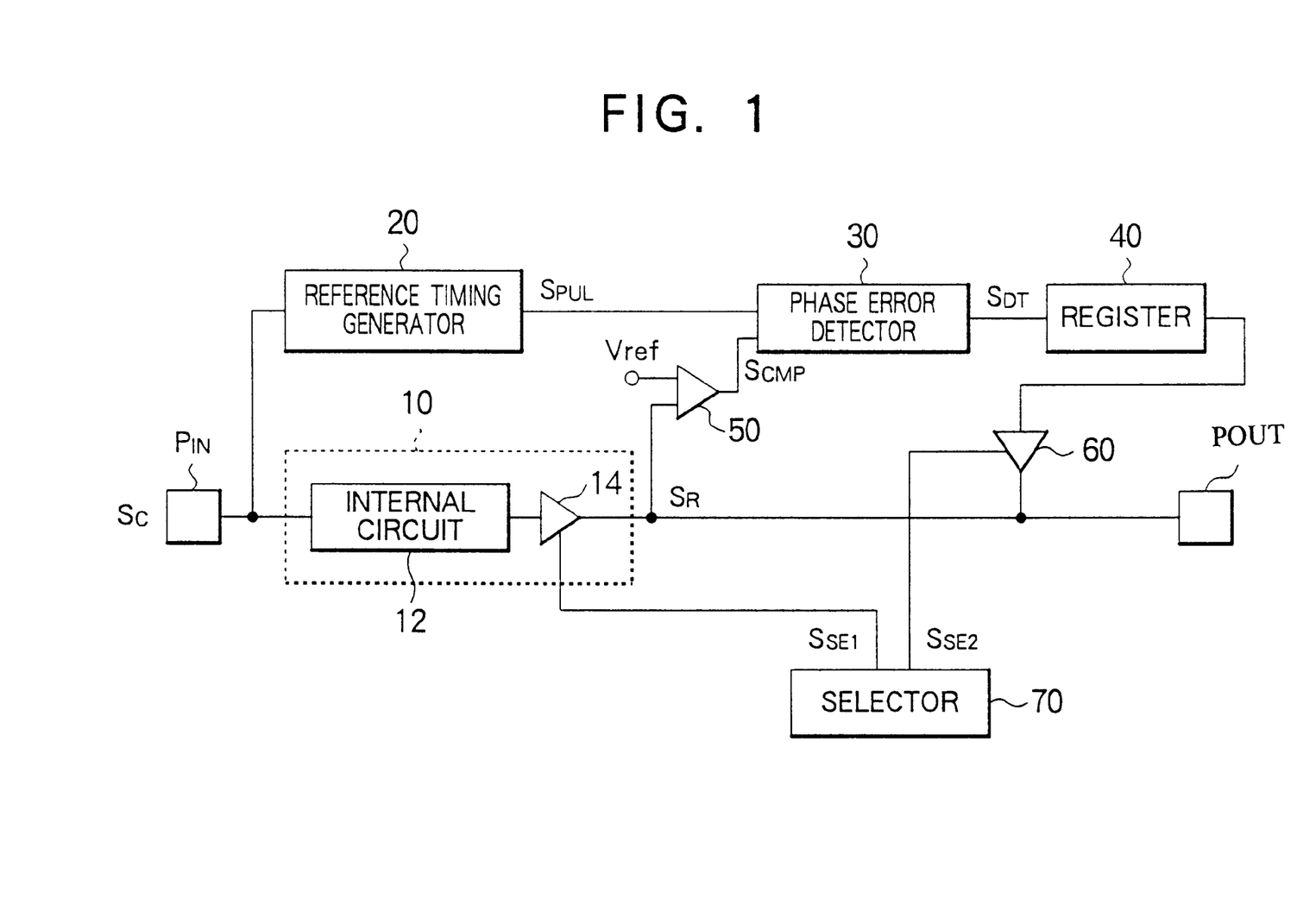
FIG. 1 is a circuit diagram of a semiconductor device according to a first embodiment of the present invention.

FIG. 1 is a circuit diagram of a semiconductor device according to a first embodiment of the present invention.

As illustrated, the semiconductor device of the present embodiment is constituted by a functional circuit 10, a reference timing generator 20, a phase error detector 30, a register 40, a comparator 50, a buffer 60, and a selector 70. Further, the functional circuit 10 is constituted by an internal circuit 12 and an output buffer 14.

Note that the functional circuit 10 is a circuit having predetermined functions such as performing predetermined arithmetic and logic operations or storage, for example, in a semiconductor memory. Except for the functional circuit 10, the other circuits constitute a test circuit provided for testing the operation of the functional circuit 10. The present invention relates to the test circuit for testing the functional circuit 10. The internal configuration, operation, and/or characteristics of the functional circuit 10 are not particularly limited.

An operation controlling signal $S_C$ is input from the outside to an input pin $P_{IN}$. In the functional circuit 10, when receiving the operation controlling signal Sc, the internal circuit 12 performs predetermined processing in accordance with that and outputs a result $S_R$ of the processing to an output pin $P_{OUT}$ through the output buffer 14.

The reference timing generator 20 receives the operation controlling signal $S_C$ from the input pin $P_{IN}$, generates a timing signal, for example, a reference pulse $S_{PUL}$ for indicating a predetermined timing, and outputs the same to the phase error detector 30 in accordance with the operation controlling signal $S_C$ as a trigger.

Note that the reference timing generator 20 can be constituted by a delay circuit delaying the input trigger by a predetermined delay time $T_D$ to generate a reference pulse $S_{PUL}$.

The comparator 50 compares the result $S_R$ of the processing of the functional circuit 10 and a reference voltage $V_{ref}$ and outputs a result $S_{cmp}$ of this comparison to the phase error detector 30. Namely, the result $S_{cmp}$ of this comparison indicates a timing of the level change of the result of processing $S_R$ of the internal circuit 12.

The phase error detector 30 detects the phase error of the reference pulse $S_{PUL}$ from the reference timing generator 20 and the result $S_{cmp}$ of the comparison from the comparator 50 and outputs a phase error signal (judging signal) $S_{DT}$ in accordance with the result of detection. For example, in the case when the phase of the result $S_{cmp}$ of the comparison is ahead of that of the reference pulse $S_{PUL}$, a judging signal $S_{DT}$ of a high level is output, while in the case when the phase of the result $S_{cmp}$ of the comparison is behind that of the reference pulse $S_{PUL}$, a judging signal $S_{DT}$ of a low level is output. For this reason, it is possible to judge whether the functional circuit 10 could finish the processing in a predetermined time or not by examining the level of the judging signal $S_{DT}$ and to thereby judge the quality of the chip.

Note that the judging means for judging the quality of the chip based on the judging signal $S_{DT}$, not illustrated, can be formed by, for example a CPU.

The register 40 receives the judging signal $S_{DT}$ from the phase error detector 30 and holds the same temporally. Further, the judging signal $S_{DT}$ held by the register 40 is output to the buffer 60.

The selector 70 controls the outputting states of the output buffer 14 and the buffer 60. The on/off states of the output buffer 14 and the buffer 60 are controlled in accordance with, for example, selecting signals $S_{SE1}$ and $S_{SE2}$. Signals input to the input sides of the buffers are output to their output sides when the buffers are controlled to an on state. On the other hand, the output sides of the buffers are held in a high-impedance state when the buffers are controlled to an off state. Note that, only one of the output buffer 14 or the buffer 60 is set in the on state by the selector 70. The other one is set in the off state. When the output buffer 14 is set in the on state, the result of processing $S_R$ of the internal circuit 10 is output to the output pin $P_{OUT}$. In contrast to this, when the buffer 60 is set in the on state, the judging signal $S_{DT}$ held by the register 40 is output to the output pin $P_{OUT}$.

Below, the operation of the present embodiment will be explained by referring to FIG. 1. During the pre-shipment test, the phase error of the result of processing of the functional circuit 10 and the reference pulse generated by the reference timing generator 20 is detected by the phase error detector 30. According to the result of the detection from the phase error detector 30, it can be judged whether the functional circuit 10 operates normally or not. The result of the judgement is held temporally by the register 40, and the signal held is output to the output pin $P_{OUT}$ under the control of the selector 70. On the other hand, during normal operation, the functional circuit 10 performs the predetermined processing in accordance with the input signal $S_C$ input via the input pin $P_{IN}$, and the result of the processing is output to the output pin $P_{OUT}$ via the output buffer 14. In this case, the test circuit constituted by the reference timing generator 20, the phase, error detector 30, the register 40, the comparator 50, and the buffer 60 does not operate. The buffer 60 is held in the high-impedance state by the selector 70 in this case. Note that, it is effective to provide a means to cut off the power supply to each part of the test circuit during the normal operation for decreasing the power consumption.

FIGS. 2A to 2H are waveform diagrams of the operation of the semiconductor device shown in FIG. 1. Below, the operation of the present embodiment will be described in detail by referring to the circuit diagram of FIG. 1 and the wavefrom diagrams of FIGS. 2A to 2H.

During test operation, first, the output buffer 14 is set in the on state and the buffer 60 is set in the off state by the selector 70. In accordance with the operation controlling signal $S_C$ input via the input pin $P_{IN}$, the predetermined processing is performed by the internal circuit 12 of the functional circuit 10, and the result of the processing is output to the output pin $P_{OUT}$ via the output buffer 14. On the other hand, in the test circuit, the reference pulse $S_{PUL}$ is generated in accordance with the controlling signal $S_C$ input via the input pin $P_{IN}$ and output to the phase error detector 30.

Figure 2A:
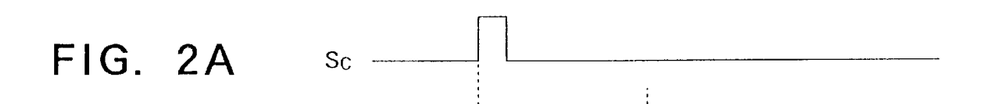
FIGS. 2A to 2H are waveform diagrams of the operation of the semiconductor device of FIG. 1.
Figure 2B:
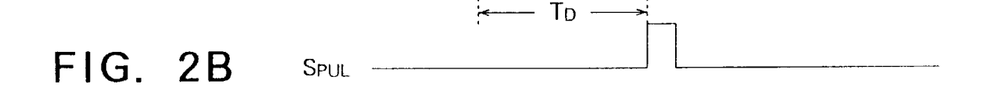
Figure 2C:
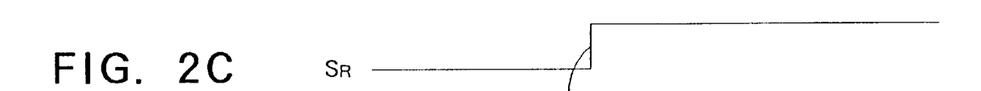
Figure 2D:
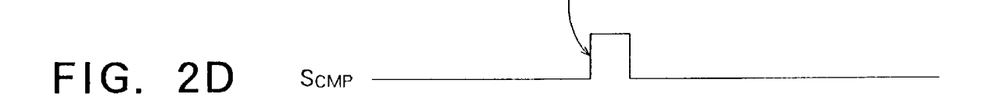

In the comparator 50, the result $S_{cmp}$ of the comparison indicating the timing of the level change of the result of processing $S_R$ is output based on the result of the comparison of the result of processing $S_R$ output to the output pin $P_{OUT}$ and the reference voltage $V_{ref}$. The result $S_{cmp}$ of the comparison is able to take any form capable of indicating the timing of the level change of the result of processing $S_R$. As shown in FIG. 2D, for example, it may be a pulse signal with a predetermined width in accordance with the level change of the result of processing $S_R$.

The phase error of the reference pulse $S_{PUL}$ and the result $S_{cmp}$ of the comparison is detected by the phase error detector 30. The judging signal $S_{DT}$ is generated in accordance with the result of the detection and is held by the register 40. After the judging signal $S_{DT}$ is held by the register 40, the output buffer 14 is set in the high-impedance state, the buffer 60 is set in the on state, respectively by the selector 70, and the signal held by the register 40 is output to the output pin $P_{OUT}$.

Figure 2E:
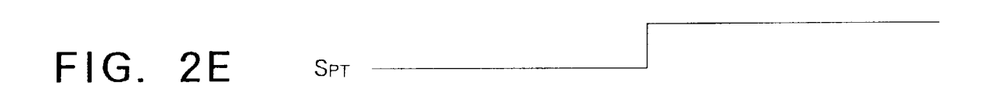
Figure 2F:
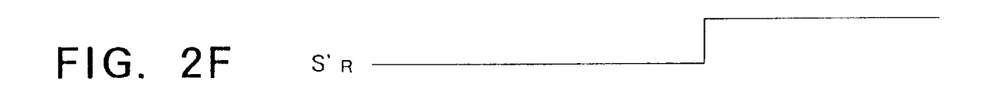
Figure 2G:
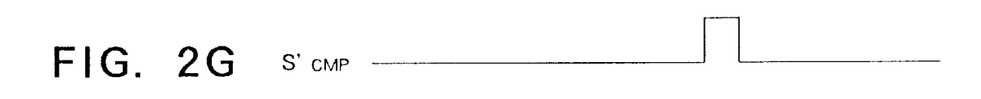
Figure 2H:
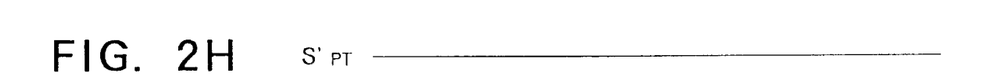

For this reason, when the held signal of the register 40 is selected by the selector 70 during the test operation, it is possible to judge whether the on-chip functional circuit 10 operates normally or not by judging the level of the judging signal $S_{DT}$ output to the output pin $P_{OUT}$. For example, as shown in FIG. 2E, when a high-level judging signal $S_{DT}$ is obtained, the timing of the level change of the result of processing $S_R$ of the functional circuit 10 is faster than that of the reference pulse $S_{PUL}$, which shows that the functional circuit 10 operates normally. On the other hand, as shown in FIG. 2H, when a low-level judging signal $S_{DT}'$ is obtained, the timing of the level change of the result of processing $S_R'$ of the functional circuit 10 is slower than that of the reference pulse $S_{PUL}$, which shows that the functional circuit 10 does not satisfy a predetermined test standard in terms of the operating speed and can be judged as a defective product.

After the test operation, the buffer 60 is held in the high-impedance state, only the output buffer 14 is held in the on state by the selector 70, and the semiconductor chip performs the normal operation. In this case, only the result of processing of the functional circuit 10 is selected and output to the output pin $P_{OUT}$. Note that, as mentioned above, for decreasing the power consumption of the chip during normal operation, it is possible to provide a means for cutting off the power supply to the test circuit and allowing power to only the functional circuit 10 so as to stop the operations of the circuits except the functional circuit 10 and lower the power consumption.

As explained above, according to the present embodiment, in addition to the functional circuit 10 performing the normal operation, there is provided an on-chip test circuit constituted by the reference timing generator 20, the phase error detector 30, the register 40, the comparator 50, and the buffer 60. The functional circuit 10 operates in response to the controlling signal $S_C$ input from the input pin $P_{IN}$ as a trigger, the comparator 50 sets its output signal $S_{CMP}$ in accordance with the timing of the result of processing $S_R$, the phase error detector 30 compares the phases of the reference pulse $S_{PUL}$ generated by the reference timing generator 20 in response to the controlling signal Sc as a trigger and the signal $S_{CMP}$, and sets the level of the judging signal $S_{DT}$ in accordance with the result of the comparison. After being held temporally by the register 40, the judging signal $S_{DT}$ is output to the output pin $P_{OUT}$ via the buffer 60. Since the held signal of the register 40 is output during the test operation and the result of processing of the functional circuit 10 is output during the normal operation by the selector 70, the quality of the chip can be detected without using any expensive LSI tester. According to this, the present embodiment is preferable for application to especially high-speed semiconductor memories.

Second Embodiment

Figure 3:
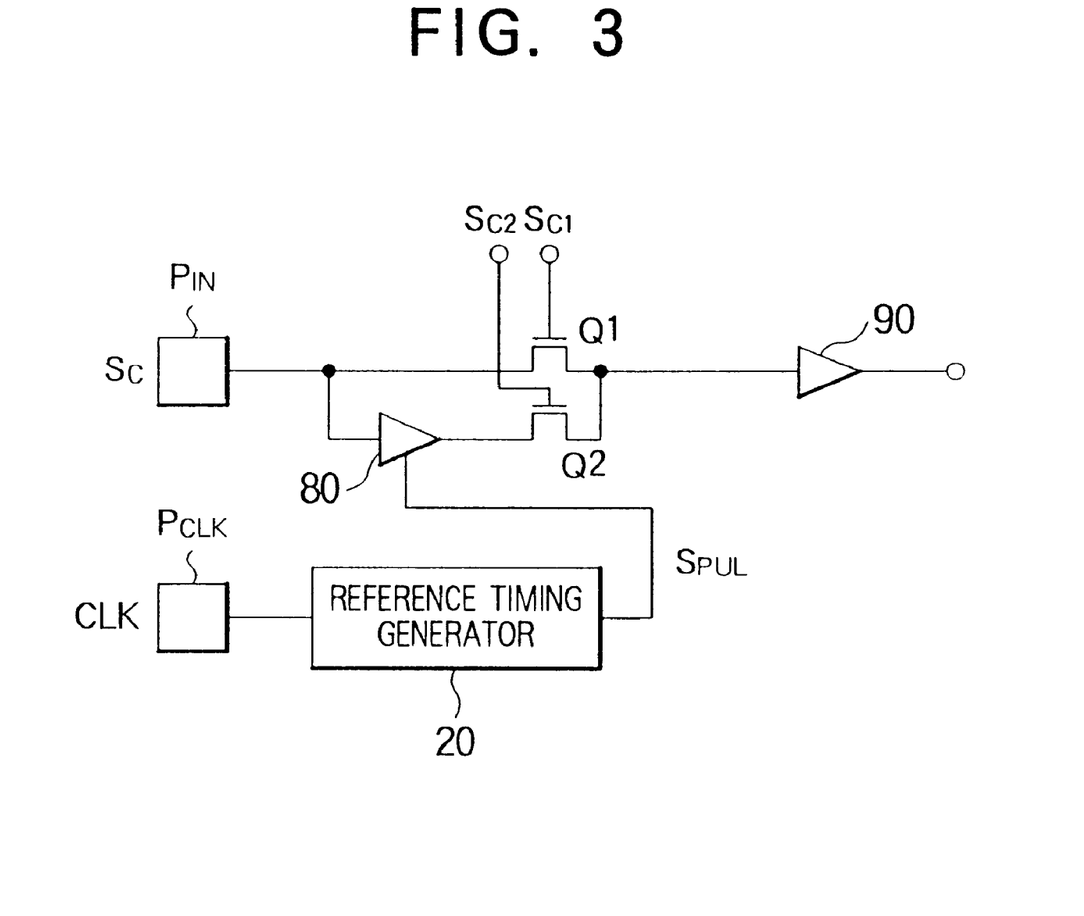
FIG. 3 is a circuit diagram of a semiconductor device according to a second embodiment of the present invention.

FIG. 3 is a circuit diagram of a semiconductor device according to a second embodiment of the present invention. The semiconductor device of the present embodiment is used for set up and holding experiments of an input signal. As illustrated, the present embodiment is constituted by a reference timing generator 20, an input buffer 80, an output buffer 90, and switches formed by transistors Q1 and Q2.

As shown in FIG. 3, a clock signal CLK is input to a clock input pin $P_{CLK}$. The reference timing generator 20 generates a reference pulse $S_{PUL}$ in accordance with the clock signal CLK. The on/off state of the input buffer 80 is controlled in accordance with the reference pulse $S_{PUL}$.

An operation controlling signal $S_C$ is input to an input pin $P_{IN}$ and transferred to the output buffer 90 through the switch formed by the transistor Q1 or through the input buffer 80 and the switch formed by the transistor Q2.

The on/off states of the switches formed by the nMOS transistors Q1 and Q2 are controlled by control signals $S_{C1}$ and $S_{C2}$ supplied to the gates of the transistors, respectively. For example, when the control signal $S_{C1}$ is at a high level, the nMOS transistor Q1 is set in an on state and the signal input to one of the diffusion layers is transferred to the other diffusion layer. Note that, the control signals $S_{C1}$ and $S_{C2}$ are set to control only one of the transistors Q1 and Q2 in the on state and not set the two in on state at the same time.

The output signal of the output buffer 90 is, for example, input into an on-chip internal circuit and sets up the operation of the same. For this reason, the circuit of the present embodiment is provided at the input side of the internal circuit which controls the input signal at a predetermined timing and inputs the same to the internal circuit.

Below, an explanation will be made of the operation of the present embodiment by referring to FIG. 3.

The reference pulse $S_{PUL}$ is generated in accordance with the clock signal CLK by the reference timing generator 20. Note that the reference timing generator 20 is constituted by, for example, a delay circuit having a predetermined delay time $T_D$ and outputs a delayed signal obtained by delaying the input clock signal CLK by the delay time $T_D$ as the reference pulse $S_{PUL}$.

The input buffer 80 is controlled in its on/off state by the reference pulse $S_{PUL}$. Here, for example, the input buffer 80 is set in the on state when the reference pulse $S_{PUL}$ is at the high level, while is set in the off state when the reference pulse $S_{PUL}$ is at the low level.

During the test operation, the nMOS transistor Q1 is set in the off state, while the nMOS transistor Q2 is set in the on state, respectively by the control signals $S_{C1}$ and $S_{C2}$. For this reason, the operation controlling signal $S_C$ input to the input pin $P_{IN}$ is transferred to the input terminal of the output buffer 90 through the transistor Q2 in its on state only when the input buffer 80 is in the on state and further fetched into the internal circuit through the output buffer 90. Namely, the timing of input of the operation controlling signal $S_C$ to the internal circuit is controlled by the reference pulse $S_{PUL}$.

During normal operation, the nMOS transistor Q1 is set in the on state while the nMOS transistor Q2 is set in the off state, respectively, by the control signals $S_{C1}$ and $S_{C2}$. For this reason, the operation controlling signal $S_C$ input to the input pin $P_{IN}$ is transferred to the input terminal of the output buffer 90 through the nMOS transistor Q1 in the on state and further fetched into the internal circuit through the output buffer 90.

As explained above, according to the present embodiment, the input buffer 80 is controlled in its on/off state in accordance with the reference pulse $S_{PUL}$ generated by the reference timing generator 20 in accordance with the clock signal CLK. During the test operation, the transistor Q1 is set in the off state while the transistor Q2 is set in the on state, respectively. The operation controlling signal $S_C$ input into the input pin $P_{IN}$ is controlled in timing by the reference pulse $S_{PUL}$, transferred to the input terminal of the output buffer 90 through the transistor Q2 in the on state, then fetched into the internal circuit. During the normal operation, the transistor Q1 is set in the on state while the transistor Q2 is set in the off state, respectively. The operation controlling signal $S_C$ input in the input pin $P_{IN}$ is transferred to the input terminal of the output buffer 90 through the transistor Q1 in the on state then fetched into the internal circuit. According to this, during the test operation, the input timing of the operation controlling signal $S_C$ to the internal circuit can be controlled by the timing set by the reference timing generator 20, and the setup and the holding of the internal circuit can be tested with high accuracy. During normal operation, the operation controlling signal Sc is input directly into the internal circuit which performs the predetermined processing accordingly.

Third Embodiment

Figure 4:
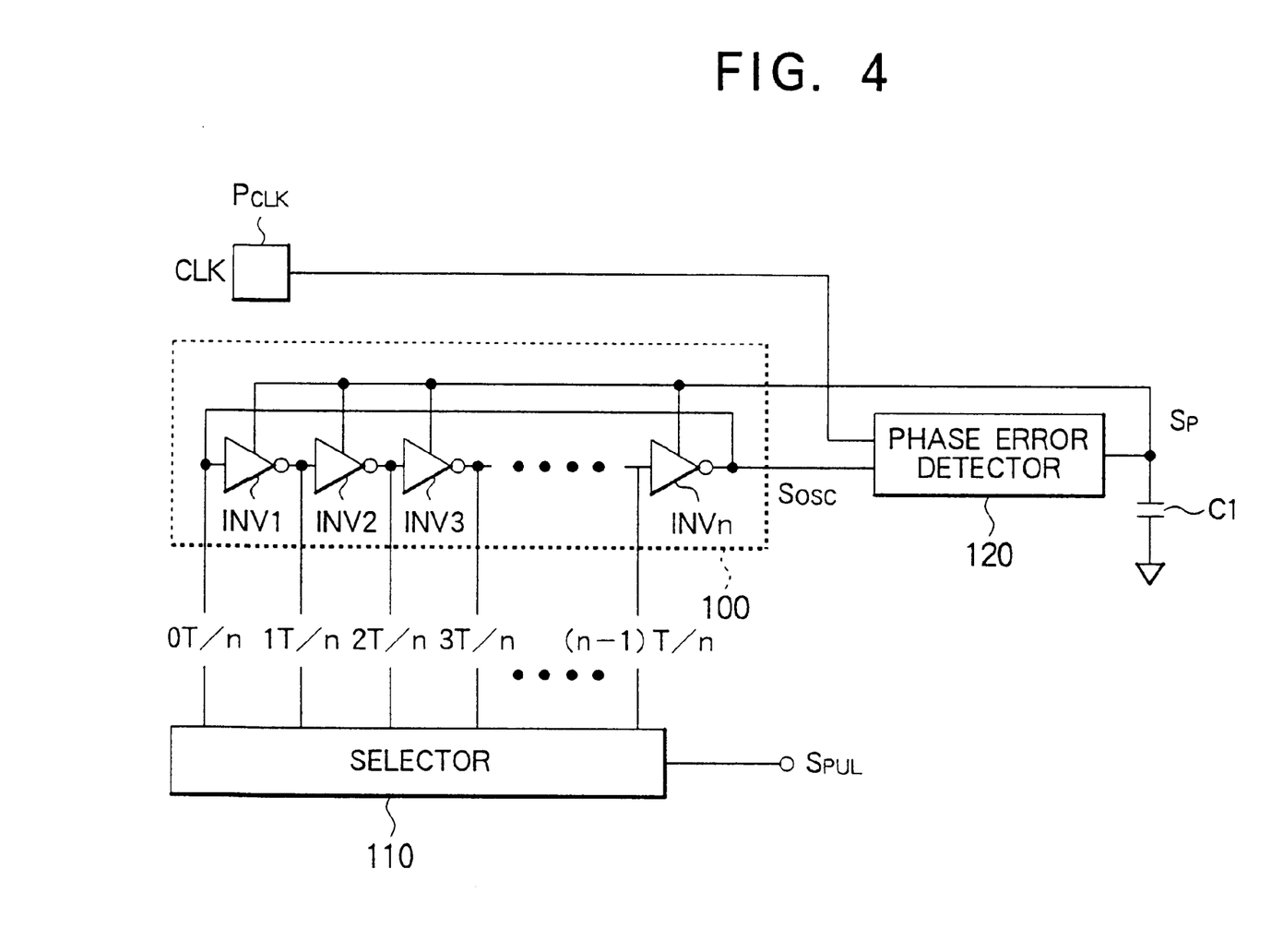
FIG. 4 is a circuit diagram of a semiconductor device according to a third embodiment of the present invention.

FIG. 4 is a circuit diagram of a semiconductor device according to a third embodiment of the present invention. In the present embodiment, when a clock signal having a predetermined cycle is input to a synchronous semiconductor device, for example, a synchronous memory, an accurate reference signal is generated by a reference timing generator formed by, for example, a PLL circuit, and the test of the semiconductor device is performed accordingly.

As illustrated in FIG. 4, the semiconductor device of the present embodiment is constituted by a reference timing generator 100 formed by a PLL circuit, a selector 110, a phase error detector 120, and a capacitor C1.

The PLL circuit 100, as illustrated, is constituted by n (n is an odd number) number of stages of inverters INVI1, INV2, INV3, . . . , INVn connected in the form of a ring. An oscillating signal $S_{OSC}$ generated by the PLL circuit 100 is input to the phase error detector 120.

The phase error detector 120 compares phases of a clock signal CLK input from an input pin $P_{CLK}$ and the oscillating signal $S_{OSC}$ from the PLL circuit 100 and outputs a phase error signal $S_P$ in accordance with the result of the comparison. Here, for example, the level of the phase error signal $S_P$ is set in proportion to the phase error of the clock signal CLK and the oscillating signal $S_{OSC}$.

A low-pass filter is constituted by the capacitor C1 and an output resistance of the phase error detector 120 by which high frequency components of the phase error signal $S_P$ are suppressed and only the low frequency components remain.

The phase error signal $S_P$ is fed back to the PLL circuit by which the oscillating operation of the PLL circuit is controlled. For example, the delay time $T_{DO}$ of the inverters INV1, INV2, INV3, . . . , INVn constituting the PLL circuit 100 is controlled by the phase error signal $S_P$. According to this, the oscillating frequency of the PLL circuit 100 follows the clock signal CLK, and a reference signal synchronous to the clock signal CLK can be generated.

Here, supposing that the delay time $T_{DO}$ of each inverter INV1, INV2, INV3, . . . , INVn constituting the PLL circuit 100 is 1/n of the period T of the clock signal CLK, n number of timing signals having a resolution of 1/n of the period T of the clock signal CLK can be generated from each inverter forming the PLL circuit 100. By outputting one of the output signals of the inverters INV1, INV2, INV3, . . . , INVn selected by the selector 110 as the reference pulse $S_{PUL}$, a reference pulse $S_{PUL}$ with a resolution of 1/n of the period T of the external signal CLK can be generated.

Since the reference pulse $S_{PUL}$ selected and output by the selector 110 is generated synchronously with the external clock CLK by the PLL circuit 100, further having the resolution of 1/n of the period T of the clock CLK, it can be generated with high precision without being influenced by the variations in the production of semiconductor chips. For example, when the period T of the external clock CLK is 5.0 ns and the n is equal to 21, the reference pulse $S_{PUL}$ can be generated at a units of 0.238 ns and a reference signal with a high precision can be provided. Further, when timing unable to be expressed by the resolution is necessary, it is possible to change the period of the external clock somewhat for coping with this situation.

Below, an explanation will be made of the operation of the present embodiment by referring to FIG. 4. As illustrated, an oscillating signal $S_{OSC}$ having a predetermined period is generated by the PLL circuit 100 and input to the phase error detector 120 together with the external clock signal CLK input from the input pin $P_{IN}$. The phases of the two input signals are compared by the phase error detector 120. A phase error signal $S_P$, for example, in proportion to the phase error, is output in accordance with the result of comparison.

The high frequency component of the phase error signal $S_P$ is suppressed, and the low frequency component of the same is fed back to the PLL circuit 100 and the oscillating frequency of the PLL circuit 100 is controlled accordingly. For this reason, the oscillating signal $S_{OSC}$ of the PLL circuit 100 is kept synchronous with the external clock signal CLK. Further, the delay time $T_{DO}$ of each of the n number of inverters forming the PLL circuit 100 is set as 1/n of the period T of the clock signal CLK, and n number of timing signals with a resolution of 1/n of the period T of the clock signal CLK can be generated.

One of the output signals of the inverters INV1, INV2, INV3, . . . , INVn is selected by the selector 110 and output as the reference pulse $S_{PUL}$. According to this, a reference pulse $S_{PUL}$ with a resolution of 1/n of the period T of the clock signal CLK is generated.

As explained above, according to the present embodiment, the PLL circuit 100 is formed by n number of stages of the inverters INV1, INV2, INV3, . . . , INVn. The phases of the oscillating signal $S_{OSC}$ generated thereby and the external clock signed CLK are compared by the phase error selector 120 from which a phase error signal $S_P$ having a level in proportion to the phase error is output. The high frequency component of the phase error signal $S_P$ is suppressed by the low-pass filter. By feeding back the low frequency component of the same to the PLL circuit for controlling the oscillating frequency, the oscillating signal $S_{OSC}$ synchronous with the external clock signal CLK can be generated. Further, the delay time $T_{DO}$ of each of the n number of stages of the inverters constituting the PLL circuit is set as 1/n of the period T of the external clock CLK. By outputting one of the output signals of the inverters INV1, INV2, INV3, . . . , INVn, selected by the selector 120 as the reference pulse $S_{PUL}$, a reference pulse $S_{PUL}$ having a resolution of 1/n of the period T of the external clock signal CLK can be generated. As a result, the operation of the chip can be tested with a high precision by using the reference pulse $S_{PUL}$. In accordance with this, it is particularly preferable to apply the present embodiment to a high speed semiconductor device, etc.

As explained above, according to the present invention, the operation of the chip can be tested by a built-in on-chip test circuit with a high precision without making use of an LSI tester. There is therefore the advantage that a high accuracy pre-shipment test of the chip can be realized while keeping down costs.

While the invention has been described with reference to specific embodiments chosen for purposes of illustration, it should be apparent that numerous modifications could be made thereto by those skilled in the art without departing from the basic concept and scope of the invention.

What is claimed is:

1. A semiconductor device having a functional circuit for performing predetermined processing in response to an input signal and for testing the operation of the functional circuit, comprising:

a reference signal generator for generating a reference signal at a predetermined timing in response to the input signal;

level comparison means for (1) comparing a level of a processed signal of said functional circuit and a predetermined reference level and (2) outputting a comparison signal; and phase comparison means for (1) comparing phases of the comparison signal and the reference signal (2) outputting a phase error signal in response to the result of the phase comparison, wherein said reference signal generator comprises a delay circuit for delaying the input signal by a predetermined delay time and outputting the delayed signal as the reference signal.

2. A semiconductor device as set forth in claim 1, wherein said reference signal generator comprises a phase-locked loop circuit for generating an oscillation signal at a predetermined frequency in response to the value of the input signal.

3. A semiconductor device as set forth in claim 1, further comprising an output controlling means for (1) selecting the processed signal during a non-test operation or the phase error signal during a test operation and (2) outputting the signal selected thereby.

4. A semiconductor device as set forth in claim 3, wherein said output controlling means comprises:

a first outputting circuit for outputting the processed signal of the functional circuit in response to a first selecting signal;

a second outputting circuit for outputting the phase error signal in response to a second selecting signal; and a selecting means for setting the first and the second selecting signals.

5. A semiconductor device as set forth in claim 1, further comprising a holding means for holding the phase error signal.

6. A semiconductor device as set forth in claim 5, comprising an output controlling means for (1) selecting the processed signal of the functional circuit or the phase error signal held by the holding means and (2) outputting the selected signal.

7. A semiconductor device as set forth in claim 6, wherein said output controlling means comprises:

a first outputting circuit for outputting the processed signal of the functional circuit in response to a first selecting signal;

a second outputting circuit for outputting the phase error signal held by the holding means in response to a second selecting signal; and a selecting means for setting the first and the second selecting signals.

8. A semiconductor integrated circuit, comprising:

a processing circuit connected to at least one input pin of said semiconductor integrated circuit, said processing circuit generating a processed output signal in response to a signal on said at least one input pin and transmitting the processed output signal to at least one output pin of said semiconductor integrated circuit; and an operational testing circuit comprising:

a reference signal generating circuit connected to said at least one input pin, said reference signal generating circuit generating a reference signal in response to the signal on said at least one input pin;

a comparator circuit connected to receive the processed output signal and a predetermined signal, said comparator circuit generating a binary output signal in response to a level comparison of the processed output signal and the predetermined signal;

a phase comparison circuit connected to receive the binary output signal and the reference signal, said phase comparison circuit generating a binary phase error output signal in response to a phase comparison of the binary output signal and the reference signal; and a storage circuit connected to receive the binary phase error output signal, said storage circuit storing the binary phase error output signal.

9. The semiconductor integrated circuit of claim 8, further comprising:

output selection circuitry connected to said processing circuit and said storage circuit, said output selection circuitry generating a plurality of output signals to selectively route the processed output signal or the binary phase error output signal to said at least one output pin of said semiconductor integrated circuit.

10. The semiconductor integrated circuit of claim 9, wherein said output selection circuitry comprises:

a first selectively operable buffer circuit connected to receive the processed output signal from said processing circuit and a first output signal from said output selection circuitry; and a second selectively operable buffer circuit connected to receive the stored binary phase error output signal from said storage circuit and a second output signal from said output selection circuitry, wherein said first buffer circuit transmits the processed output signal therethrough to said at least one output pin when said output selection circuitry generates the first output signal and said second buffer circuit transmits the stored binary phase error signal therethrough to said at least one output pin when said output selection circuitry generates the second output signal.

11. The semiconductor integrated circuit of claim 8, wherein said reference signal generating circuit comprises a signal delay circuit.

12. The semiconductor integrated circuit of claim 8, wherein said reference signal generating circuit comprises a phase-locked loop circuit.

13. A semiconductor device having a functional circuit for performing predetermined processing in response to an input signal and for testing the operation of the functional circuit, comprising:

a reference signal generator for generating a reference signal at a predetermined timing in response to the input signal;

level comparison means for (1) comparing a level of a processed signal of said functional circuit and a predetermined reference level and (2) outputting a comparison signal;

phase comparison means for (1) comparing phases of the comparison signal and the reference signal (2) outputting a phase error signal in response to the result of the phase comparison; and an output controlling means for (1) selecting the processed signal during a non-test operation or the phase error signal during a test operation and (2) outputting the signal selected thereby.

14. A semiconductor device as set forth in claim 13, wherein said reference signal generator comprises a phase-locked loop circuit for generating an oscillation signal at a predetermined frequency in response to the value of the input signal.

15. A semiconductor device as set forth in claim 13, wherein said output controlling means comprises:

a first outputting circuit for outputting the processed signal of the functional circuit in response to a first selecting signal;

a second outputting circuit for outputting the phase error signal in response to a second selecting signal; and a selecting means for setting the first and the second selecting signals.

16. A semiconductor device as set forth in claim 13, further comprising a holding means for holding the phase error signal.

17. A semiconductor device having a functional circuit for performing predetermined processing in response to an input signal and for testing the operation of the functional circuit, comprising:
- a reference signal generator for generating a reference signal at a predetermined timing in response to the input signal;
- level comparison means for (1) comparing a level of a processed signal of said functional circuit and a predetermined reference level and (2) outputting a comparison signal;
- phase comparison means for (1) comparing phases of the comparison signal and the reference signal (2) outputting a phase error signal in response to the result of the phase comparison; and
- a holding means for holding the phase error signal.

18. A semiconductor device as set forth in claim 17, wherein said reference signal generator comprises a phase-locked loop circuit for generating an oscillation signal at a predetermined frequency in response to the value of the input signal.

19. A semiconductor device as set forth in claim 17, further comprising an output controlling means for (1) selecting the processed signal during a non-test operation or the phase error signal during a test operation and (2) outputting the signal selected thereby.

20. A semiconductor device as set forth in claim 19, wherein said output controlling means comprises:
- a first outputting circuit for outputting the processed signal of the functional circuit in response to a first selecting signal;
- a second outputting circuit for outputting the phase error signal in response to a second selecting signal; and
- selecting means for setting the first and the second selecting signals.

21. A semiconductor integrated circuit, comprising:
- a processing circuit connected to at least one input pin of said semiconductor integrated circuit, said processing circuitry generating a processed output signal in response to a signal on said at least one input pin and transmitting the processed output signal to at least one output pin of said semiconductor integrated circuit; and
- an operational testing circuit comprising:
  - a reference signal generating circuit connected to said at least one input pin, said reference signal generating circuit generating a reference signal in response to the signal on said at least one input pin;
  - a comparator circuit connected to receive the processed output signal and a predetermined signal, said comparator circuit generating a binary output signal in response to a level comparison of the processed output signal and the predetermined signal;
  - a phase comparison circuit connected to receive the binary output signal and the reference signal, said phase comparison circuit generating a binary phase error output signal in response to a phase comparison of the binary output signal and the reference signal; and
  - output selection circuitry generating a plurality of output signals to selectively route the processed output signal or the binary phase error output signal to said at least one output pin of said semiconductor integrated circuit.

22. The semiconductor integrated circuit of claim 21, further comprising:
- a storage circuit connected to receive the binary phase error output signal, said storage circuit storing the binary phase error output signal.

23. The semiconductor integrated circuit of claim 22, wherein said output selection circuitry comprises:
- a first selectively operable buffer circuit connected to receive the processed output signal from said processing circuit and a first output signal from said output selection circuitry; and
- a second selectively operable buffer circuit connected to receive the stored binary phase error output signal from said storage circuit and a second output signal from said output selection circuitry,
- wherein said first buffer circuit transmits the processed output signal therethrough to said at least one output pin when said output selection circuitry generates the first output signal and said second buffer circuit transmits the stored binary phase error signal therethrough to said at least one output pin when said output selection circuitry generates the second output signal.

24. The semiconductor integrated circuit of claim 21, wherein said reference signal generating circuit comprises a signal delay circuit.

25. The semiconductor integrated circuit of claim 21, wherein said reference signal generating circuit comprises a phase-locked loop circuit.

26. A semiconductor integrated circuit, comprising:
- a processing circuit connected to at least one input pin of said semiconductor integrated circuit, said processing circuitry generating a processed output signal in response to a signal on said input pin and transmitting the processed output signal to at least one output pin of said semiconductor integrated circuit; and
- an operational testing circuit comprising:
  - a reference signal generating circuit connected to said input pin, said reference signal generating circuit generating a reference signal in response to the signal on said input pin;
  - a comparator circuit connected to receive the processed output signal and a predetermined signal, said comparator circuit generating a binary output signal in response to a level comparison of the processed output signal and the predetermined signal; and
  - a phase comparison circuit connected to receive the binary output signal and the reference signal, said phase comparison circuit generating a binary phase error output signal in response to a phase comparison of the binary output signal and the reference signal,
  - wherein said reference signal generator comprises a signal delay circuit.

27. The semiconductor integrated circuit of claim 26, further comprising:
- a storage circuit connected to receive the binary phase error output signal, said storage circuit storing the binary phase error output signal.

28. The semiconductor integrated circuit of claim 27, further comprising:
- output selection circuitry connected to said processing circuit and said storage circuit, said output selection circuitry generating a plurality of output signals to selectively route the processed output signal or the binary phase error output signal to said at least one output pin of said semiconductor integrated circuit.

29. The semiconductor integrated circuit of claim 28, wherein said output selection circuitry comprises:
- a first selectively operable buffer circuit connected to receive the processed output signal from said processing circuit and a first output signal from said output selection circuitry; and a second selectively operable buffer circuit connected to receive the stored binary phase error output signal from said storage circuit and a second output signal from said output selection circuitry, wherein said first buffer circuit transmits the processed output signal therethrough to said at least one output pin when said output selection circuitry generates the first output signal and said second buffer circuit transmits the stored binary phase error signal therethrough to said at least one output pin when said output selection circuitry generates the second output signal.

30. The semiconductor integrated circuit of claim 26, wherein said reference signal generating circuit comprises a phase-locked loop circuit.

* * * * *

UNITED STATES PATENT AND TRADEMARK OFFICE
CERTIFICATE OF CORRECTION

PATENT NO.   : 6,154,074
DATED        : November 28, 2000
INVENTOR(S)  : Katsuya Nakashima It is certified that error appears in the above-identified patent and that said Letters Patent is hereby corrected as shown below:

Column 9,
Line 31, should read,
        6. A semiconductor device as set forth in claim 1, further comprising an output controlling means for (1) selecting the processed signal during a non-test operation or the phase error signal during a test operation and (2) outputting the signal selected thereby.

Signed and Sealed this

Eighteenth Day of June, 2002

*Attest:*

*Attesting Officer*

JAMES E. ROGAN
*Director of the United States Patent and Trademark Office*